United States Patent
Kushida

(10) Patent No.: US 7,663,942 B2
(45) Date of Patent: Feb. 16, 2010

(54) SEMICONDUCTOR MEMORY DEVICE HAVING LOCAL AND GLOBAL BIT LINES

(75) Inventor: Keiichi Kushida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 11/946,390

(22) Filed: Nov. 28, 2007

(65) Prior Publication Data

US 2008/0130383 A1    Jun. 5, 2008

(30) Foreign Application Priority Data

Nov. 30, 2006   (JP)   ............................... 2006-324991

(51) Int. Cl.
*G11C 7/00*   (2006.01)
(52) U.S. Cl. ............. 365/191; 365/230.02; 365/189.02; 365/154; 365/226
(58) Field of Classification Search ................. 365/191, 365/201, 189.02, 230.02
See application file for complete search history.

(56) References Cited

U.S. PATENT DOCUMENTS

| | | | | |
|---|---|---|---|---|
| 5,034,923 A | * | 7/1991 | Kuo et al. | 365/189.16 |
| 6,031,777 A | * | 2/2000 | Chan et al. | 365/210.1 |
| 6,560,141 B2 | | 5/2003 | Osada et al. | |
| 7,095,652 B2 | * | 8/2006 | Higashi et al. | 365/185.13 |
| 7,099,218 B2 | * | 8/2006 | Wicht et al. | 365/207 |
| 7,385,864 B2 | * | 6/2008 | Loh et al. | 365/201 |
| 7,495,979 B2 | * | 2/2009 | Chung | 365/201 |

FOREIGN PATENT DOCUMENTS

JP   10-241400   9/1998

* cited by examiner

*Primary Examiner*—Connie C Yoha
(74) *Attorney, Agent, or Firm*—Oblon, Spivak, McClelland, Maier & Neustadt, L.L.P.

(57) ABSTRACT

A semiconductor memory device includes a plurality of memory cell columns each having a plurality of memory cells, each memory cell including being a static type, a plurality of local bit lines connected to the memory cell columns, a global bit line connected to the local bit lines via a plurality of sense amplifiers, a measurement terminal to which a measurement voltage is applied in a cell current measurement mode, and a plurality of switching circuits provided to correspond to the local bit lines, and configured to electrically connect the measurement terminal and one of the local bit lines in the cell current measurement mode.

20 Claims, 8 Drawing Sheets

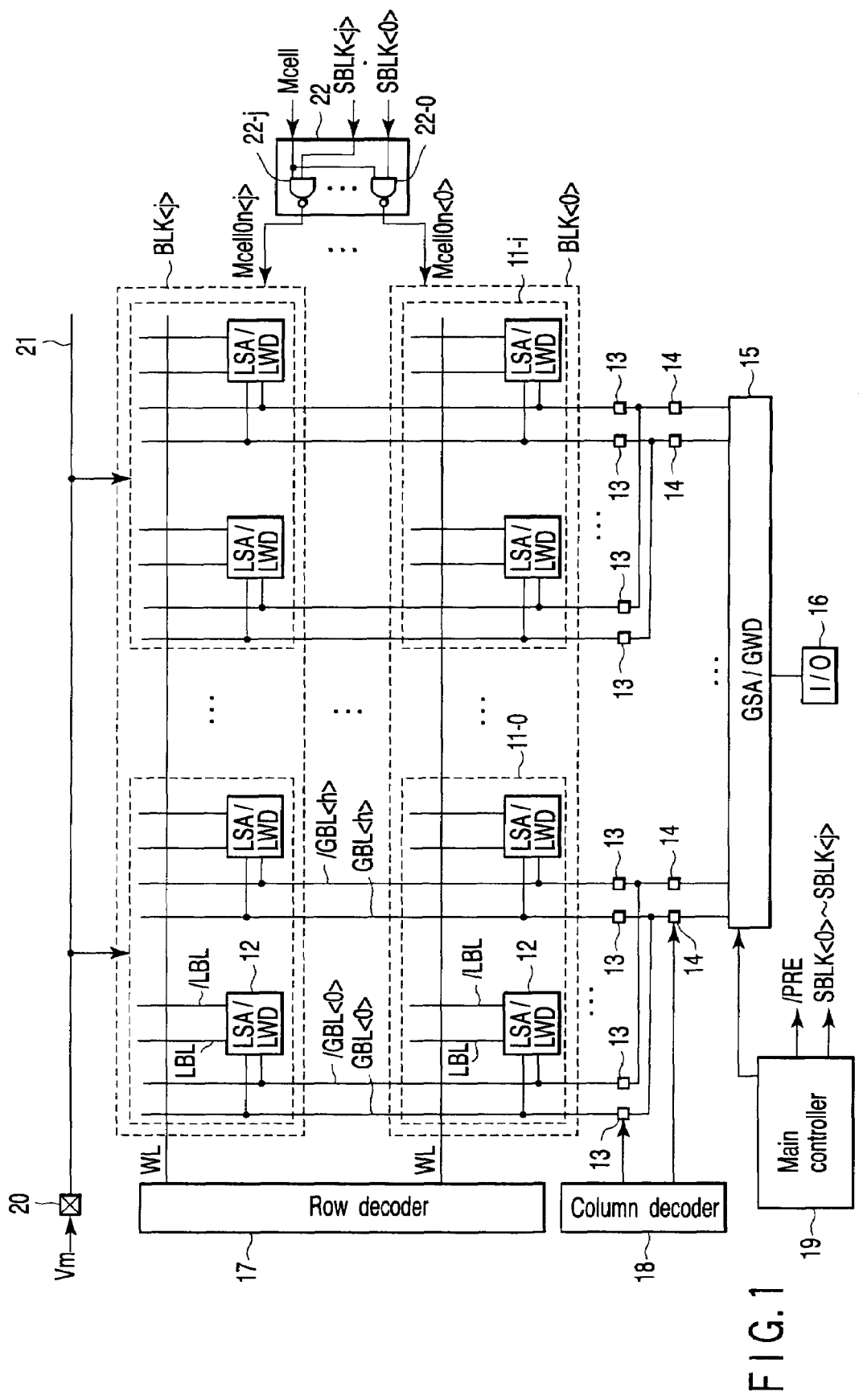
F I G. 1

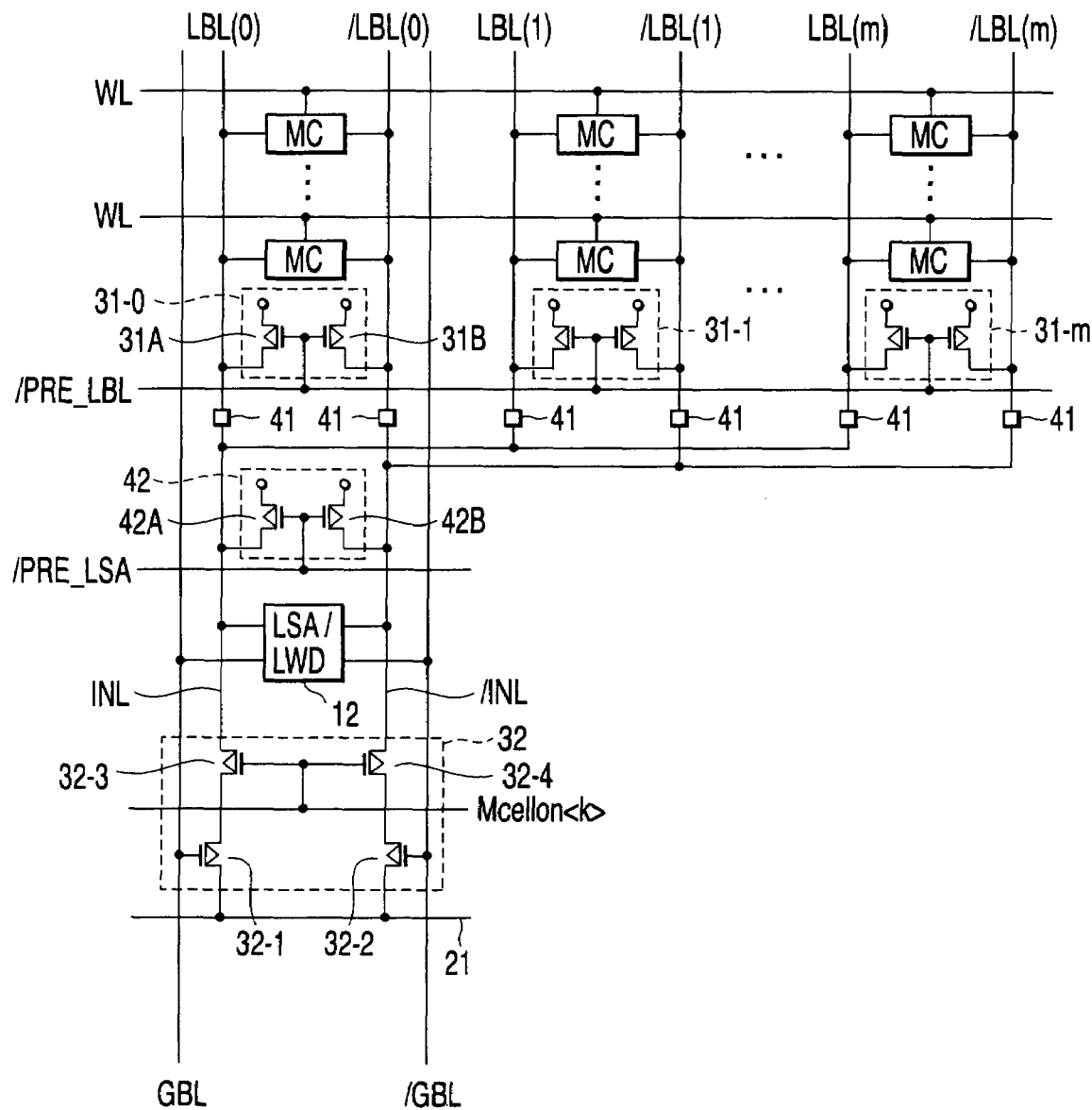
F I G. 4

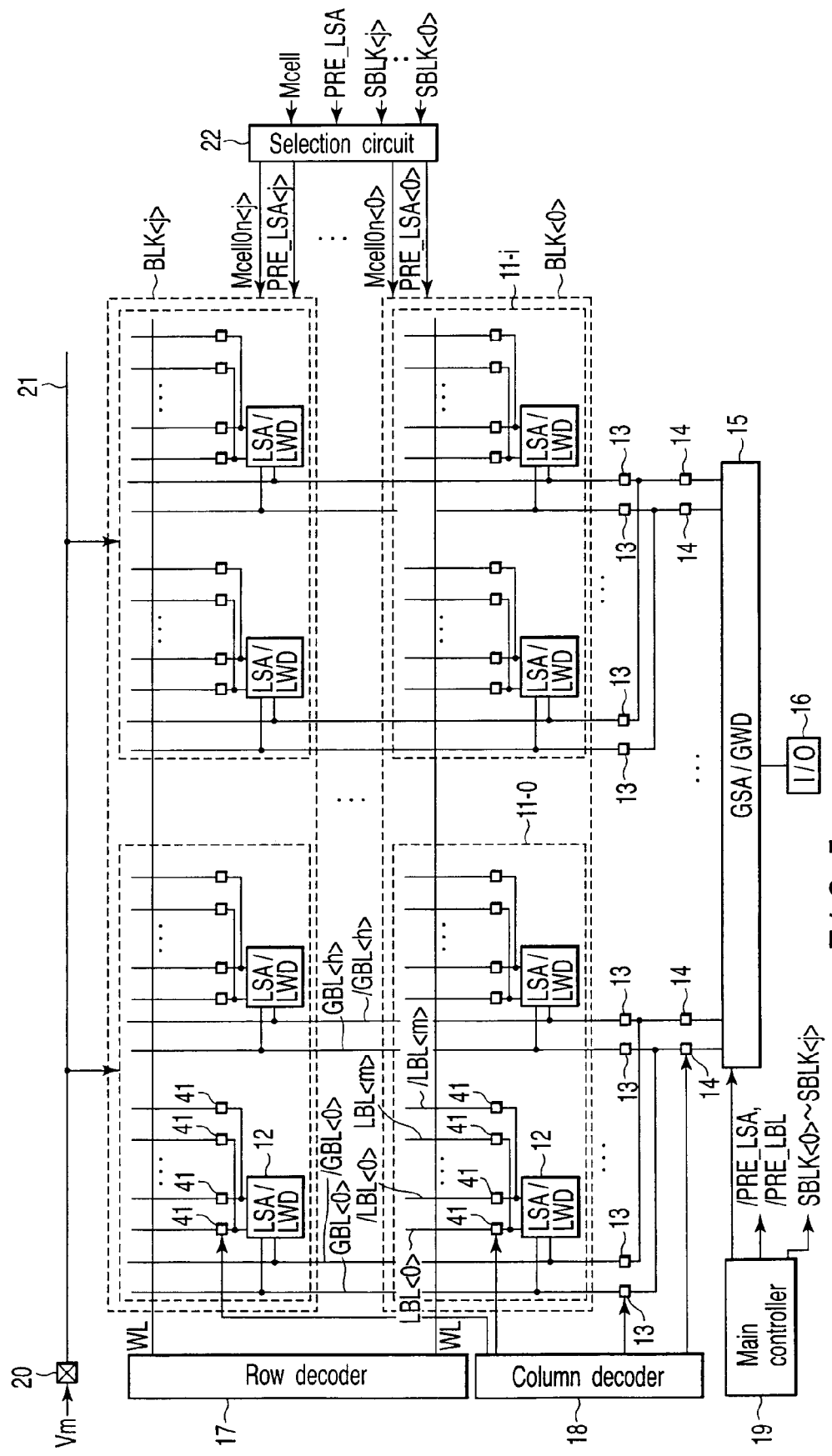
F I G. 5

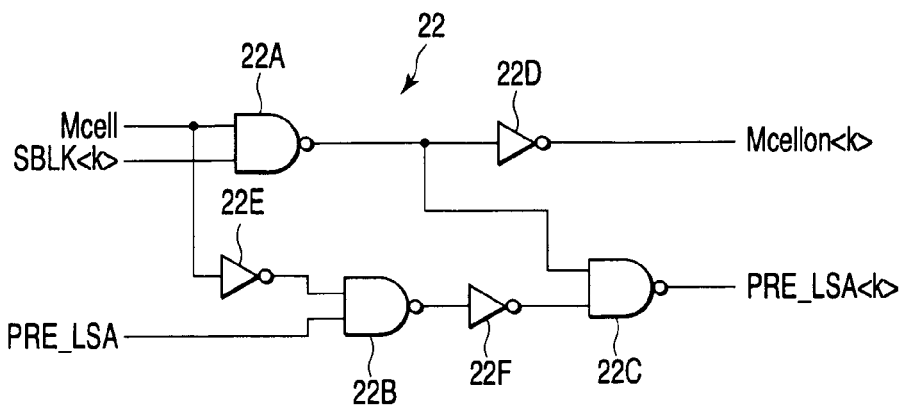
F I G. 6
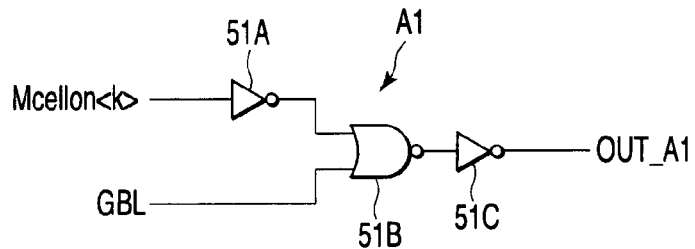
F I G. 8
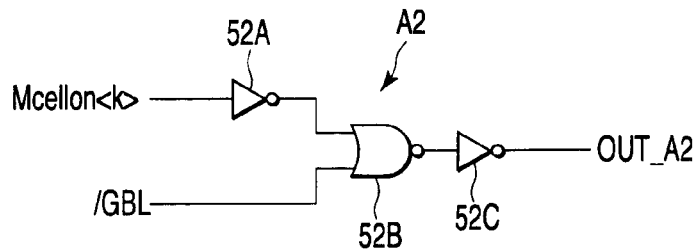
F I G. 9
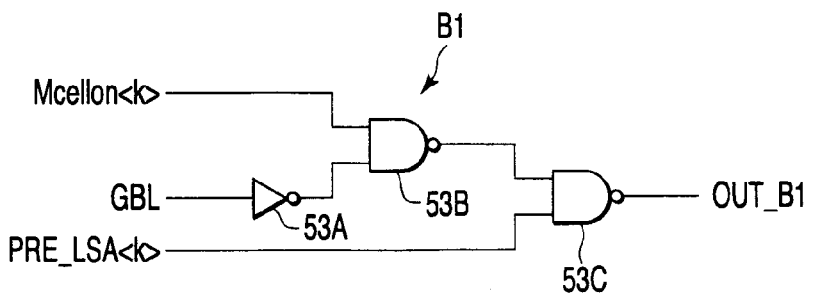
F I G. 10

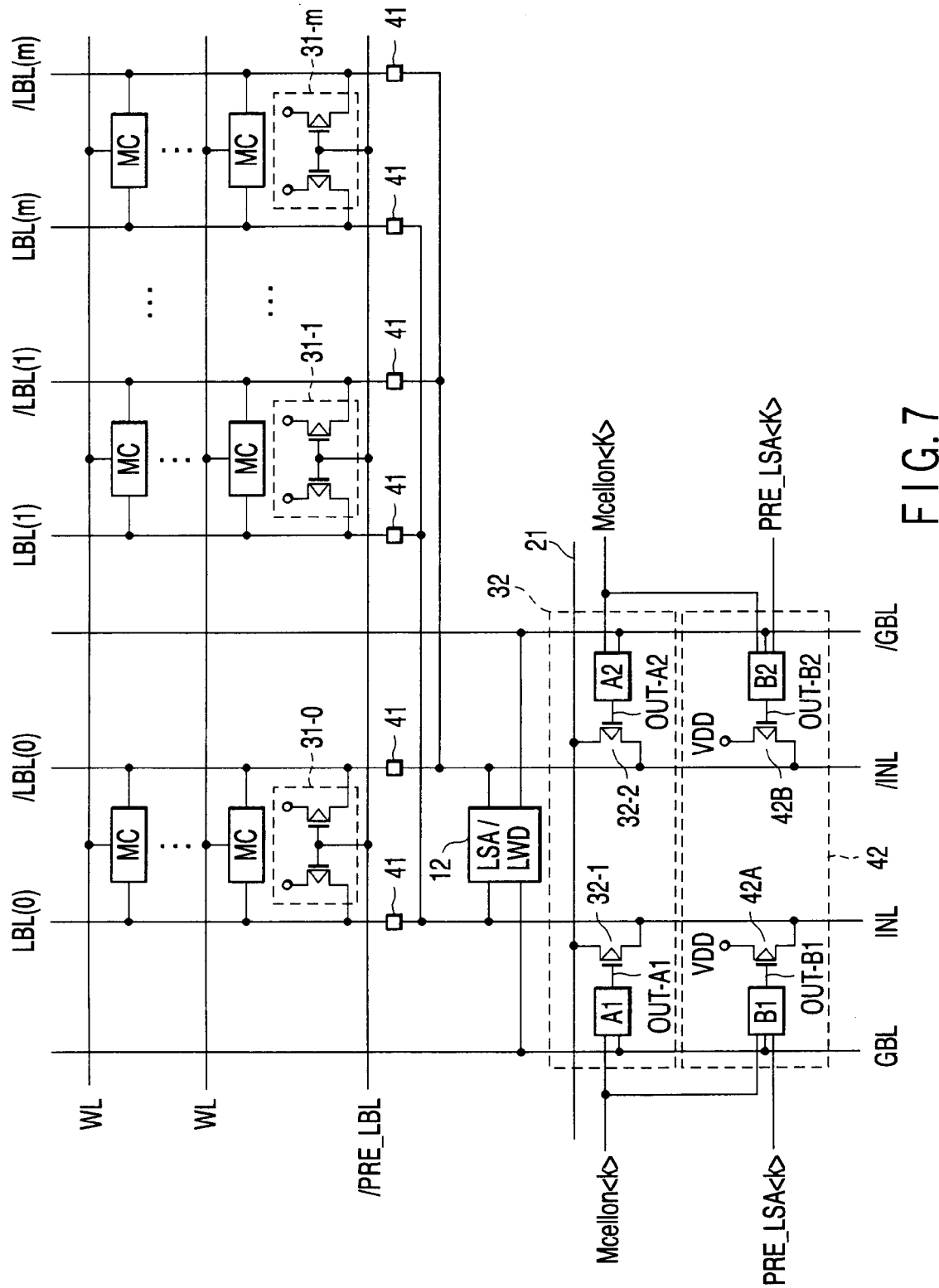
F I G. 7

| | Selected LSA | | Unselected LSA | |
|---|---|---|---|---|
| | Normal operation | Measurement mode | Normal operation | Measurement mode |
| OUT_A1 | H | L/H | H | H |
| OUT_A2 | H | H/L | H | H |
| OUT_B1 | /PRE_LSA | H | /PRE_LSA | L |
| OUT_B2 | /PRE_LSA | H | /PRE_LSA | L |
| Mcellon | L | H | L | L* |
| /PRE_LBL | /PRE_LBL | H | /PRE_LBL | H |

\* When the unselected LSA is in a block different from a block including the selected LSA

US 7,663,942 B2

SEMICONDUCTOR MEMORY DEVICE HAVING LOCAL AND GLOBAL BIT LINES

CROSS-REFERENCE TO RELATED APPLICATIONS

This application is based upon and claims the benefit of priority from prior Japanese Patent Application No. 2006-324991, filed Nov. 30, 2006, the entire contents of which are incorporated herein by reference.

BACKGROUND OF THE INVENTION

1. Field of the Invention

The present invention relates to a semiconductor memory device, e.g., a static random access memory (SRAM).

2. Description of the Related Art

In recent SRAMs, the scaling of the cell size is advancing with the development of the micropatterning technique, and a read current per memory cell is lowering accordingly. In addition, the variation in cell current amount is increasing due to the increase in memory capacity and processing variations. Consequently, a memory cell having the smallest cell current of all memory cells makes it difficult to increase the operating speed of the SRAM. Under the circumstances, the importance of a method of accurately measuring the cell current of a fabricated memory cell is increasing in order to analyze defects and manage production lines.

On the other hand, an SRAM having a hierarchical bit line structure capable of data read with a small cell current has been developed. The hierarchical bit line structure is a circuit system in which a bit line comprises a local bit line and global bit line. The local bit line is connected to a local sense amplifier and local write driver. The global bit line is connected to a global sense amplifier and global write driver.

More specifically, a plurality of local bit lines whose bit line capacitance is reduced by finely dividing a bit line are connected to a plurality of local sense amplifiers. The local sense amplifier amplifies data and sends the amplified data to the global bit line. The global sense amplifier connected to the global bit line determines the data. That is, cell data is read out by the two stages of bit lines/sense amplifiers. By thus hierarchizing the bit lines, the capacitance of each bit line can be reduced, and this makes it possible to reduce the cell current.

In this hierarchical bit line type SRAM, a method that outputs the cell current to a pad by selecting a local bit line and global bit line by column switches is conventionally used as a method of directly measuring the cell current. In this method, however, a cell current flowing through only the local bit line is output outside via the global bit line and a few column switch stages. Therefore, the parasitic resistances and leakage noise of the global bit line and column switches interfere with accurate cell current measurement.

As a related technique of this kind, a technique that suppresses the increase in chip size by using one cell current monitoring bus is disclosed (Jpn. Pat. Appln. KOKAI Publication No. 10-241400).

BRIEF SUMMARY OF THE INVENTION

According to a first aspect of the present invention, there is provided a semiconductor memory device comprising: a plurality of memory cell columns each having a plurality of memory cells, each memory cell including a plurality of MIS (Metal Insulator Semiconductor) transistors and being a static type; a plurality of local bit lines connected to the memory cell columns, respectively; a global bit line connected to the local bit lines via a plurality of sense amplifiers; a measurement terminal to which a measurement voltage is applied in a cell current measurement mode; and a plurality of switching circuits provided to correspond to the local bit lines, and configured to electrically connect the measurement terminal and one of the local bit lines in the cell current measurement mode.

According to a second aspect of the present invention, there is provided a semiconductor memory device comprising: a plurality of blocks each having a plurality of memory cell columns, each memory cell column having a plurality of memory cells, and each memory cell including a plurality of MIS transistors and being a static type; a plurality of local bit lines connected to the memory cell columns, respectively; a plurality of intermediate lines provided to correspond to the blocks, each intermediate line being connected to the local bit lines via a plurality of column switches; a global bit line connected to the intermediate lines via a plurality of sense amplifiers; a measurement terminal to which a measurement voltage is applied in a cell current measurement mode; and a plurality of switching circuits provided to correspond to the intermediate lines, and configured to electrically connect the measurement terminal and one of the intermediate lines in the cell current measurement mode.

BRIEF DESCRIPTION OF THE SEVERAL VIEWS OF THE DRAWING

FIG. 1 is a schematic view illustrating the arrangement of an SRAM according to the first embodiment of the present invention;

FIG. 4 is a circuit diagram mainly illustrating a pair of global bit lines GBL and /GBL and a plurality of pairs of local bit lines LBL and /LBL corresponding to the global bit line pair in the SRAM shown in FIG. 3;

FIG. 5 is a schematic view illustrating the arrangement of an SRAM according to the third embodiment of the present invention;

FIG. 6 is a circuit diagram illustrating an example of a selection circuit 22 shown in FIG. 5;

FIG. 7 is a circuit diagram mainly illustrating a pair of global bit lines GBL and /GBL and a plurality of pairs of local bit lines LBL and /LBL corresponding to the global bit line pair in the SRAM shown in FIG. 5;

FIG. 8 is a circuit diagram illustrating an example of a signal generator A1 shown in FIG. 7;

FIG. 9 is a circuit diagram illustrating an example of a signal generator A2 shown in FIG. 7;

FIG. 10 is a circuit diagram illustrating an example of a signal generator B1 shown in FIG. 7;

DETAILED DESCRIPTION OF THE INVENTION

Figure 2:
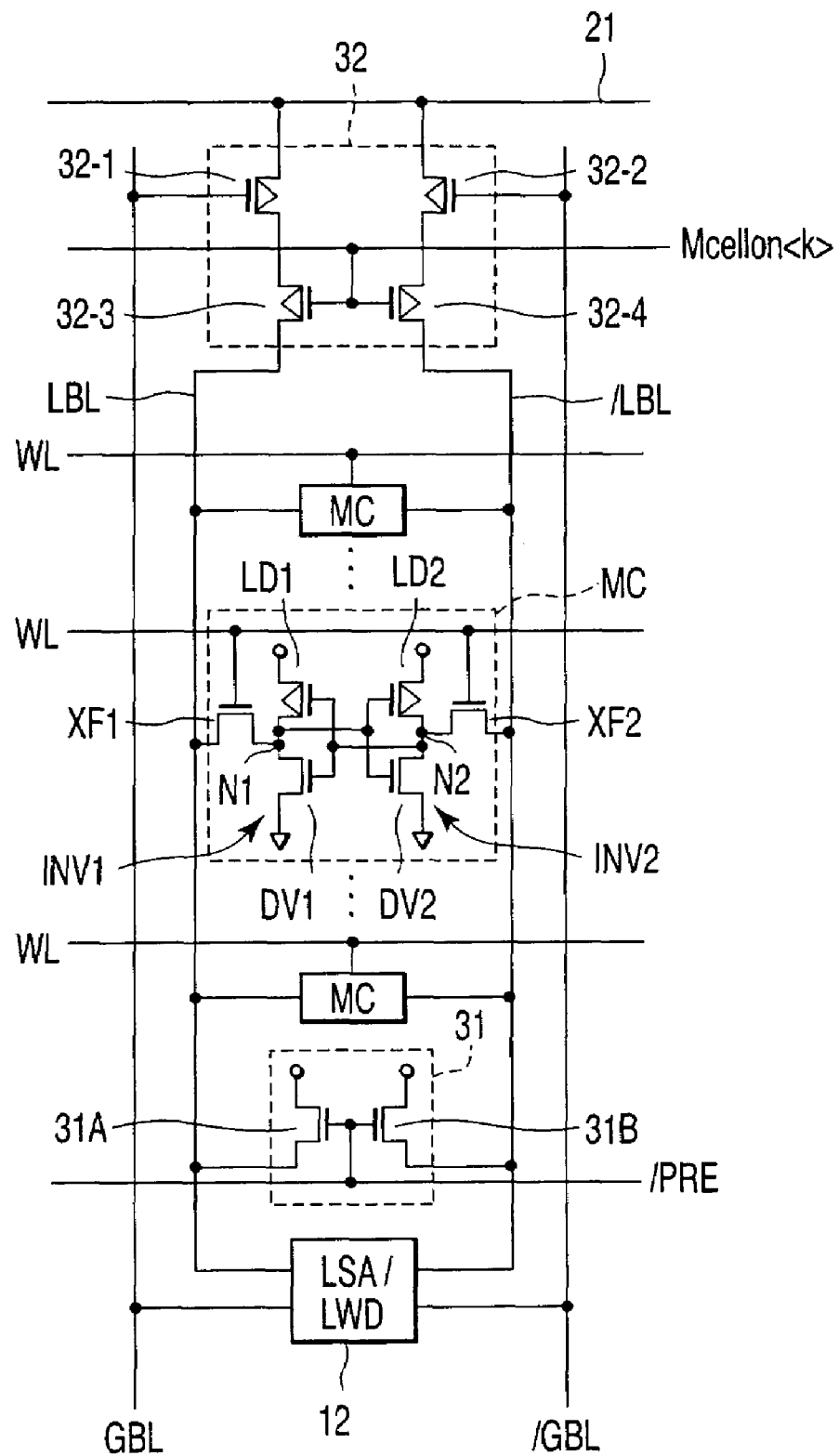
FIG. 2 is a circuit diagram mainly illustrating a pair of global bit lines GBL and /GBL and a pair of local bit lines LBL and /LBL corresponding to the global bit line pair in the SRAM shown in FIG. 1.

Embodiments of the present invention will be explained below with reference to the accompanying drawing. Note that in the following explanation, the same reference numerals denote elements having the same functions and arrangements, and a repetitive explanation will be made only when necessary.

First Embodiment

FIG. 1 is a schematic view illustrating the arrangement of an SRAM according to the first embodiment of the present invention. This SRAM comprises blocks BLK<0> to BLK<j>. The blocks BLK<0> to BLK<j> are sequentially arranged adjacent to each other in the column direction. Each block BLK includes subarrays 11-0 to 11-i. The subarrays 11-0 to 11-i are sequentially arranged adjacent to each other in the row direction. Each subarray 11 includes static memory cells MC.

The SRAM of this embodiment has a hierarchical bit line structure. Also, the SRAM of this embodiment is an example of the arrangement of an SRAM in which a global bit line GBL and a local bit line LBL connected to the global bit line GBL are "1:1" in each block BLK.

More specifically, each subarray 11 has (h+1) pairs of global bit lines GBL<0> to GBL<h> and /GBL<0> to /GBL<h>. The blocks BLK<0> to BLK<j> share the pairs of global bit lines GBL<0> to GBL<h> and /GBL<0> to /GBL<h>. That is, (j+1) subarrays 11 adjacent to each other in the column direction have the (h+1) pairs of global bit lines GBL<0> to GBL<h> and /GBL<0> to /GBL<h> to be shared by these subarrays.

In each block BLK, each pair of global bit lines GBL and /GBL are connected to a pair of local bit lines LBL and /LBL via a local sense amplifier (LSA)/local write driver (LWD) 12. Also, each block BLK has word lines WL running in the row direction. The subarrays 11 included in the block BLK share the word lines WL.

The global bit lines GBL<0> to GBL<h> are connected to a column switch 14 via column switches 13. Similarly, the global bit lines /GBL<0> to /GBL<h> are connected to a column switch 14 via column switches 13. Each column switch 14 is connected to a global sense amplifier (GSA)/global write driver (GWD) 15. That is, the pairs of global bit lines GBL and /GBL formed in each subarray 11 of the block BLK are bundled by the column switches 14 and connected to the GSA/GWD 15. This similarly applies to global bit lines formed on other subarrays.

The GSA/GWD 15 is connected to an input/output terminal 16. Externally input data is supplied to the GSA/GWD 15 via the input/output terminal (I/O) 16. Output data is output outside via the input/output terminal (I/O) 16.

The GSA/GWD 15 (more specifically, the GWD) writes externally input data (corresponding to write data). Also, the GSA/GWD 15 (more specifically, the GSA) reads (senses and amplifies) data transferred from the pairs of bit lines LBL and /LBL.

The LSA/LWD 12 (more specifically, the LWD) writes data transferred from the pair of bit lines GBL and /GBL. The LSA/LWD 12 (more specifically, the LSA) reads data transferred from the memory cells MC.

The word lines WL are connected to a row decoder 17. On the basis of an externally supplied row address signal, the row decoder 17 selects a corresponding one of the word lines WL.

All the column switches 13 and 14 are connected to a column decoder 18. On the basis of an externally supplied column address signal, the column decoder 18 controls ON/OFF of the column switches 13 and 14. That is, on the basis of the column address signal, the column decoder 18 selects a corresponding one of the pairs of global bit lines GBL and /GBL.

A main controller 19 controls the individual circuits in the SRAM. The main controller 19 receives clock signals, control signals, and the like from external circuits. On the basis of these control signals, the main controller 19 controls, e.g., a precharge operation, write operation, and read operation.

The SRAM has a measurement terminal 20 as an external power supply terminal to which a measurement voltage Vm used to measure the cell current of a memory cell is supplied. The measurement terminal 20 is connected to each subarray 11 via a power line 21.

The SRAM includes a selection circuit 22 that generates a selection signal Mcellon for selecting a block BLK as an object of cell current measurement. A measurement mode signal Mcell for measuring the cell current is externally input to the selection circuit 22. In addition, the main controller 19 supplies block selection signals SBLK<0> to SBLK<j> to the selection circuit 22. The main controller 19 generates the block selection signal SBLK on the basis of a row address signal and column address signal input from the outside.

The selection circuit 22 generates the selection signal Mcellon on the basis of the measurement mode signal Mcell and block selection signal SBLK. More specifically, the selection circuit 22 comprises NAND circuits 22-0 to 22-j corresponding to the (j+1) blocks BLK. Each of the NAND circuits 22-0 to 22-j receives a corresponding one of the block selection signals SBLK<0> to SBLK<j> at one input terminal. Each of the NAND circuits 22-0 to 22-j receives the measurement mode signal Mcell at the other input terminal. In a cell current measurement mode (when the measurement mode signal Mcell is at high level), therefore, the selection circuit 22 selects a block BLK as an object of cell current measurement.

FIG. 2 is a circuit diagram mainly illustrating a pair of global bit lines GBL and /GBL and a pair of local bit lines LBL and /LBL corresponding to the global bit line pair. Assume that a given block BLK<k> includes the pair of local bit lines LBL and /LBL shown in FIG. 2.

The pair of local bit lines LBL and /LBL are connected to the memory cells MC arranged in the column direction. Each memory cell MC includes a first inverter circuit INV1 and second inverter circuit INV2.

The first inverter circuit INV1 comprises a p-channel MOS transistor (PMOS transistor) LD1 as a load, and an n-channel MOS transistor (NMOS transistor) DV1 for driving. Note that this embodiment uses a MOS (Metal Oxide Semiconductor) transistor that is a kind of a MIS (Metal Insulator Semiconductor) transistor. The PMOS transistor LD1 and NMOS transistor DV1 are connected in series between a power supply terminal to which a power supply voltage VDD is supplied, and a ground terminal to which a ground voltage VSS is supplied.

The second inverter circuit INV2 comprises a PMOS transistor LD2 as a load and an NMOS transistor DV2 for driving. The PMOS transistor LD2 and NMOS transistor DV2 are connected in series between the power supply terminal to which the power supply voltage VDD is supplied, and the ground terminal.

More specifically, the source terminal of the PMOS transistor LD1 is connected to the power supply terminal. The drain terminal of the PMOS transistor LD1 is connected to the drain terminal of the NMOS transistor DV1 via a memory node N1. The gate terminal of the PMOS transistor LD1 is connected to the gate terminal of the NMOS transistor DV1.

The source terminal of the NMOS transistor DV1 is connected to the ground terminal.

The source terminal of the PMOS transistor LD2 is connected to the power supply terminal. The drain terminal of the PMOS transistor LD2 is connected to the drain terminal of the NMOS transistor DV2 via a memory node N2. The gate terminal of the PMOS transistor LD2 is connected to the gate terminal of the NMOS transistor DV2. The source terminal of the NMOS transistor DV2 is connected to the ground terminal.

The gate terminal of the PMOS transistor LD1 is connected to the memory node N2. The gate terminal of the PMOS transistor LD2 is connected to the memory node N1. In other words, the first inverter circuit INV1 and second inverter circuit INV2 are connected by cross coupling. That is, the output terminal of the first inverter circuit INV1 is connected to the input terminal of the second inverter circuit INV2, and the output terminal of the second inverter circuit INV2 is connected to the input terminal of the first inverter circuit INV1.

The memory node N1 is connected to the local bit line LBL via a transfer gate XF1 that is an NMOS transistor. The gate terminal of the transfer gate XF1 is connected to the word line WL.

The memory node N2 is connected to the local bit line /LBL via a transfer gate XF2 that is an NMOS transistor. The gate terminal of the transfer gate XF2 is connected to the word line WL. The memory cell MC is constructed as described above.

The pair of local bit lines LBL and /LBL are connected to a precharge circuit 31. The precharge circuit 31 precharges the pair of local bit lines LBL and /LBL to a high-level voltage (e.g., the power supply voltage VDD) before read and write operations are executed. The precharge circuit 31 executes this precharge operation on the basis of a precharge signal /PRE supplied from the main controller 19. That is, the precharge circuit 31 precharges the pair of local bit lines LBL and /LBL to the power supply voltage VDD when the precharge signal /PRE is activated (to low level), and cancels precharging when the precharge signal /PRE is deactivated (to high level).

The precharge circuit 31 includes two PMOS transistors 31A and 31B. The source terminal of the PMOS transistor 31A is connected to a power supply terminal to which the power supply voltage VDD is supplied. The drain terminal of the PMOS transistor 31A is connected to the local bit line LBL. The precharge signal /PRE is supplied to the gate terminal of the PMOS transistor 31A.

The source terminal of the PMOS transistor 31B is connected to a power supply terminal to which the power supply voltage VDD is supplied. The drain terminal of the PMOS transistor 31B is connected to the local bit line /LBL. The precharge signal /PRE is supplied to the gate terminal of the PMOS transistor 31B. The precharge circuit 31 is constructed as described above.

Each of all the pairs of local bit lines LBL and /LBL is connected to a measurement switching circuit 32 used to measure the cell current. The measurement switching circuit 32 comprises four PMOS transistors 32-1 to 32-4. The PMOS transistor 32-3 controlled by the selection signal Mcellon and the PMOS transistor 32-1 controlled by the potential of the global bit line GBL are connected in series, and this series circuit connects the local bit line LBL and power line 21. Likewise, the PMOS transistor 32-4 controlled by the selection signal Mcellon and the PMOS transistor 32-2 controlled by the potential of the global bit line /GBL are connected in series, and this series circuit connects the local bit line /LBL and power line 21.

More specifically, the source terminal of the PMOS transistor 32-1 is connected to the power line 21. The gate terminal of the PMOS transistor 32-1 is connected to the global bit line GBL. The drain terminal of the PMOS transistor 32-1 is connected to the source terminal of the PMOS transistor 32-3. A selection signal Mcellon<k> is supplied to the gate terminal of the PMOS transistor 32-3. The drain terminal of the PMOS transistor 32-3 is connected to the local bit line LBL.

The source terminal of the PMOS transistor 32-2 is connected to the power line 21. The gate terminal of the PMOS transistor 32-2 is connected to the global bit line /GBL. The drain terminal of the PMOS transistor 32-2 is connected to the source terminal of the PMOS transistor 32-4. The selection signal Mcellon<k> is supplied to the gate terminal of the PMOS transistor 32-4. The drain terminal of the PMOS transistor 32-4 is connected to the local bit line /LBL.

The operation of the SRAM constructed as above will be explained below. In normal operations (read and write operations except for the cell current measurement mode) of the SRAM, the measurement mode signal Mcell is deactivated (to low level).

Accordingly, the selection circuit 22 outputs high-level selection signals Mcellon<0> to Mcellon<j>. In this state, the PMOS transistors 32-3 and 32-4 included in all the measurement switching circuits 32 are turned off. This electrically disconnects the pairs of local bit lines LBL and /LBL from the power line 21. Consequently, the measurement voltage Vm is not transmitted to the pairs of local bit lines LBL and /LBL regardless of the states of the pairs of global bit lines GBL and /GBL. Therefore, normal read and write operations can be performed in the normal operation mode.

The cell current measurement mode for measuring the cell current of a given memory cell MC will now be explained. Assume that, in the memory cell MC (measurement cell) as an object of measurement, data "0" is written in the memory node N1 on the side of the local bit line LBL, and data "1" is written in the memory node N2 on the side of the local bit line /LBL.

First, the measurement mode signal Mcell is activated (to high level). Subsequently, the block selection signal SBLK of the block BLK including the measurement cell is activated (to high level). Accordingly, the selection circuit 22 activates only the selection signal Mcellon of the selected block BLK (to low level). Simultaneously, data "0" is input to the global bit line GBL to which the measurement cell is connected (this global bit line is set at a low-level voltage), and data "1" is input to all the other global bit lines GBL and /GBL (these global bit lines are set at a high-level voltage).

In this state, only the local bit line LBL connected to the measurement cell is connected to the power line 21. When the word line WL connected to the measurement cell is activated in this state, a current path is formed from the power line 21 to the ground terminal via the measurement cell. A cell current corresponding to the measurement voltage Vm at that time is measured via the measurement terminal 20.

Note that when measuring the cell current of a measurement cell storing opposite data (a measurement cell in which data "1" is written in the memory node N1 on the side of the local bit line LBL), opposite data need only be set in the global bit lines GBL and /GBL.

In this embodiment as described in detail above, the current path formed from the power line 21 to the ground terminal via the measurement cell includes neither global bit lines nor column switches. Since this protects the measurement cell from the influence of the parasitic resistances and leakage noise of the global bit lines and column switches, the cell current can be measured with high accuracy.

Also, the power line 21 can be formed above the memory cells MC by using a thick line in an upper layer. Since this makes it possible to reduce the parasitic resistance and leakage noise of the power line 21, the cell current can be measured with high accuracy.

Furthermore, in this embodiment, the increase in area caused by the addition of the measurement switching circuit 32 is about 3% when the local bit line length is 128 bits cell/LBL and the memory capacity is 1 Mbits. Accordingly, the increase in area of an SRAM can be decreased when this embodiment is applied.

Note that it is not always necessary to newly form the measurement terminal 20. That is, an external power supply terminal to which a bit line voltage VBL (more specifically, the high-level voltage of the local bit line LBL) is supplied may also be used as the measurement terminal 20. In this case, the power line 21 is a VBL line. The embodiment can be similarly practiced even when constructed in this way.

Second Embodiment

The second embodiment is an example of the arrangement of an SRAM in which a plurality of local bit lines LBL are connected to one global bit line GBL in each block BLK.

Figure 3:
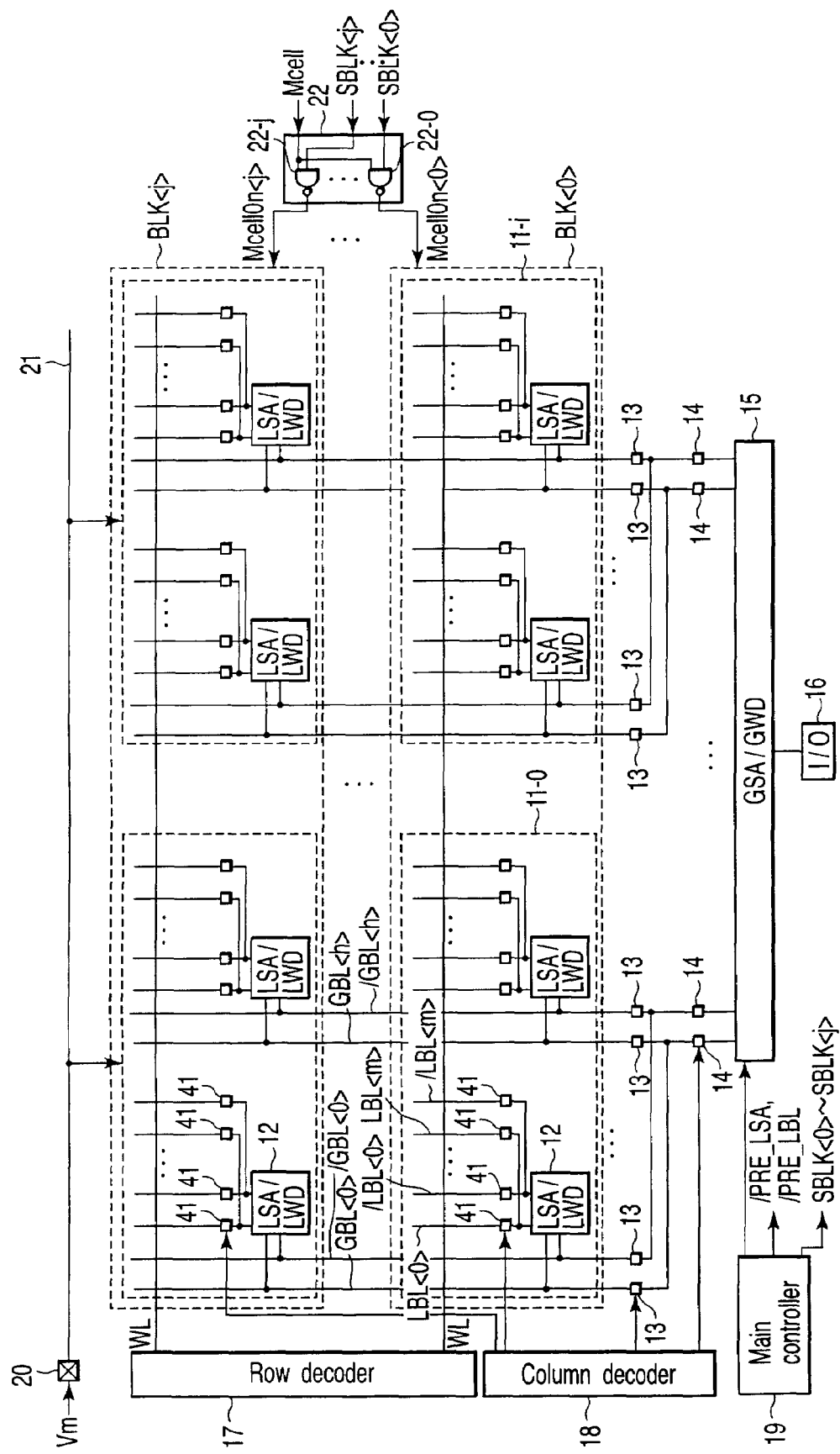
FIG. 3 is a schematic view illustrating the arrangement of an SRAM according to the second embodiment of the present invention.

FIG. 3 is a schematic view illustrating the arrangement of the SRAM according to the second embodiment. The SRAM comprises blocks BLK<0> to BLK<j>. The blocks BLK<0> to BLK<j> are sequentially arranged adjacent to each other in the column direction. Each block BLK includes subarrays 11-0 to 11-i. The subarrays 11-0 to 11-i are sequentially arranged adjacent to each other in the row direction.

The SRAM of this embodiment has a hierarchical bit line structure. Also, the SRAM of this embodiment is an example of the arrangement of an SRAM in which a global bit line GBL and local bit lines LBL connected to the global bit line GBL are "1:n (n is an integer of 2 or more)" in each block BLK.

More specifically, each subarray 11 has (h+1) pairs of global bit lines GBL<0> to GBL<h> and /GBL<0> to /GBL<h>. The blocks BLK<0> to BLK<j> share the pairs of global bit lines GBL<0> to GBL<h> and /GBL<0> to /GBL<h>. In addition, (m+1) pairs of local bit lines LBL<0> to LBL<m> and /LBL<0> to /LBL<m> are connected to each pair of global bit lines GBL and /GBL via an LSA/LWD 12.

The (m+1) pairs of local bit lines LBL and /LBL are connected to the LSA/LWD 12 via column switches 41. All the column switches 41 are connected to a column decoder 18. The column decoder 18 controls ON/OFF of the column switches 41 on the basis of a column address signal. That is, on the basis of the column address signal, the column decoder 18 selects a corresponding one of the pairs of local bit lines LBL and /LBL.

FIG. 4 is a circuit diagram mainly illustrating a pair of global bit lines GBL and /GBL and pairs of local bit lines LBL and /LBL corresponding to the global bit line pair. Assume that a given block BLK<k> includes the pairs of local bit lines LBL and /LBL shown in FIG. 4.

The pair of local bit lines LBL<0> and /LBL<0> are connected to memory cells MC arranged in the column direction. The arrangement of each memory cell MC is the same as in the first embodiment. The pair of local bit lines LBL<0> and /LBL<0> are connected to a precharge circuit 31-0 for the pair of local bit lines LBL<0> and /LBL<0>.

A main controller 19 supplies a precharge signal /PRE_LBL to the gate terminals of two PMOS transistors 31A and 31B forming the precharge circuit 31-0. On the basis of the precharge signal /PRE_LBL, the precharge circuit 31-0 precharges the pair of local bit lines LBL<0> and /LBL<0> to a high-level voltage (e.g., a power supply voltage VDD) before read and write operations are executed. The local bit lines LBL<1> to LBL<m> have the same arrangement as that of the pair of local bit lines LBL<0> and /LBL<0>.

The pairs of local bit lines LBL<0> and /LBL<0> to LBL<m> and /LBL<m> are connected to a pair of intermediate lines INL and /INL via the column switches 41. The pair of intermediate lines INL and /INL are connected to the pair of global lines GBL and /GBL via the LSA/LWD 12. When the column decoder 18 controls ON/OFF of the column switches 41 on the basis of the column address signal, one of the pairs of local bit lines LBL<0> and /LBL<0> to LBL<m> and /LBL<m> is connected to the pair of global bit lines GBL and /GBL via the pair of intermediate lines INL and /INL.

The pair of intermediate lines INL and /INL are connected to a precharge circuit 42 for a local sense amplifier (LSA). The precharge circuit 42 comprises two PMOS transistors 42A and 42B. The source terminals of the PMOS transistors 42A and 42B are connected to a power supply terminal to which the power supply voltage VDD is supplied. The drain terminals of the PMOS transistors 42A and 42B are respectively connected to the intermediate lines INL and /INL. The main controller 19 supplies a precharge signal /PRE_LSA to the gate terminals of the PMOS transistors 42A and 42B. On the basis of the precharge signal /PRE_LSA, the precharge circuit 42 precharges the pair of local bit lines LBL and /LBL to the high-level voltage (e.g., the power supply voltage VDD) before read and write operations are executed.

Also, the pair of intermediate lines INL and /INL are connected to a measurement switching circuit 32 used to measure the cell current. The measurement switching circuit 32 comprises four PMOS transistors 32-1 to 32-4. The PMOS transistor 32-3 controlled by a selection signal Mcellon and the PMOS transistor 32-1 controlled by the potential of the global bit line GBL are connected in series, and this series circuit connects the intermediate line INL and a power line 21. Likewise, the PMOS transistor 32-4 controlled by the selection signal Mcellon and the PMOS transistor 32-2 controlled by the potential of the global bit line /GBL are connected in series, and this series circuit connects the intermediate line /INL and power line 21.

More specifically, the source terminal of the PMOS transistor 32-1 is connected to the power line 21. The gate terminal of the PMOS transistor 32-1 is connected to the global bit line GBL. The drain terminal of the PMOS transistor 32-1 is connected to the source terminal of the PMOS transistor 32-3. A selection signal Mcellon<k> is supplied to the gate terminal of the PMOS transistor 32-3. The drain terminal of the PMOS transistor 32-3 is connected to the intermediate line INL.

The source terminal of the PMOS transistor 32-2 is connected to the power line 21. The gate terminal of the PMOS transistor 32-2 is connected to the global bit line /GBL. The drain terminal of the PMOS transistor 32-2 is connected to the source terminal of the PMOS transistor 32-4. The selection signal Mcellon<k> is supplied to the gate terminal of the PMOS transistor 32-4. The drain terminal of the PMOS transistor 32-4 is connected to the intermediate line /INL.

The operation of the SRAM constructed as above will be explained below. In normal operations (read and write operations except for a cell current measurement mode) of the SRAM, a measurement mode signal Mcell is deactivated (to low level).

Accordingly, a selection circuit 22 outputs high-level selection signals Mcellon<0> to Mcellon<j>. In this state, the PMOS transistors 32-3 and 32-4 included in all the measurement switching circuits 32 are turned off. This electrically disconnects the pair of intermediate lines INL and /INL from the power line 21. Consequently, a measurement voltage Vm is not transmitted to the pair of intermediate lines INL and /INL regardless of the states of the pairs of global bit lines GBL and /GBL. Therefore, normal read and write operations can be performed in the normal operation mode.

The cell current measurement mode for measuring the cell current of a given memory cell MC will now be explained. Assume that, in the memory cell MC (measurement cell) as an object of measurement, data "0" is written in a memory node N1 on the side of the local bit line LBL, and data "1" is written in a memory node N2 on the side of the local bit line /LBL.

First, the measurement mode signal Mcell is activated (to high level). Subsequently, a block selection signal SBLK of the block BLK including the measurement cell is activated (to high level). Accordingly, the selection circuit 22 activates only the selection signal Mcellon of the selected block BLK (to low level). Simultaneously, data "0" is input to the global bit line GBL to which the measurement cell is connected (this global bit line is set at a low-level voltage), and data "1" is input to all the other global bit lines GBL and /GBL (these global bit lines are set at a high-level voltage). Consequently, only the intermediate line INL connected to the measurement cell is connected to the power line 21.

Subsequently, the column decoder 18 turns on two column switches 41 corresponding to the pair of local bit lines LBL and /LBL connected to the measurement cell. When a word line WL connected to the measurement cell is activated in this state, a current path is formed from the power line 21 to the ground terminal via the measurement cell. A cell current corresponding to the measurement voltage Vm at that time is measured via the measurement terminal 20.

Note that when measuring the cell current of a measurement cell storing opposite data (a measurement cell in which data "1" is written in the memory node N1 on the side of the local bit line LBL), opposite data need only be set in the global bit lines GBL and /GBL.

In the SRAM constructed as above, the pair of local bit lines LBL and /LBL connected to the measurement cell are connected to the intermediate lines INL and /INL via the column switches 41. In the SRAM of this embodiment, therefore, the cell current of the measurement cell can be measured via the measurement terminal 20 by executing the cell current measurement operation explained in the first embodiment.

Also, this embodiment can measure the cell current with high accuracy by using the measurement terminal 20 even when the SRAM is constructed such that a plurality of local bit lines LBL are connected to one global bit line GBL.

Furthermore, one measurement switching circuit 32 need only be prepared for a plurality of pairs of local bit lines LBL<0> and /LBL<0> to LBL<m> and /LBL<m>. This makes it possible to decrease the ratio occupied by the measurement switching circuits 32 in the area of the SRAM.

Third Embodiment

The third embodiment measures the cell current with high accuracy by reducing the leakage current of an unselected local bit line LBL in cell current measurement.

FIG. 5 is a schematic view illustrating the arrangement of an SRAM according to the third embodiment of the present invention. Similar to the second embodiment, the SRAM of this embodiment is an example of the arrangement of an SRAM in which a global bit line GBL and local bit lines LBL connected to the global bit line GBL are "1: n (n is an integer of 2 or more)" in each block BLK.

The SRAM has a selection circuit 22. The selection circuit 22 receives a measurement mode signal Mcell from the outside. The measurement mode signal Mcell is activated (to high level) in a cell current measurement mode, and deactivated (to low level) in normal operations. Also, a main controller 19 supplies a precharge signal PRE_LSA for a local sense amplifier (LSA) and block selection signals SBLK<0> to SBLK<j> to the selection circuit 22. The precharge signal PRE_LSA is deactivated (to low level) in read and write operations, and activated (to high level) in operations except for read and write.

By using the above signals, the selection circuit 22 supplies selection signals Mcellon<0> to Mcellon<j> and precharge signals PRE_LSA<0> to PRE_LSA<j> to blocks BLK<0> to BLK<j>, respectively. FIG. 6 is a circuit diagram illustrating an example of the selection circuit 22. Note that FIG. 6 shows a circuit portion for generating a selection signal Mcellon<k> and precharge signal PRE_LSA<k> to be supplied to a given block BLK<k>. In practice, therefore, the selection circuit 22 includes circuit portions shown in FIG. 6 equal in number to the blocks BLK<0> to BLK<j>.

The selection circuit 22 comprises three NAND circuits 22A to 22C and three inverter circuits 22D to 22F. The NAND circuit 22A receives the measurement mode signal Mcell at one input terminal. The NAND circuit 22A receives a block selection signal SBLK<k> at the other input terminal. The output terminal of the NAND circuit 22A is connected to the input terminal of the inverter circuit 22D, and one input terminal of the NAND circuit 22C. The inverter circuit 22D outputs a selection signal Mcellon<k>. Accordingly, the selection signal Mcellon<k> is activated (to high level) when the cell current measurement mode is set (the measurement mode signal Mcell is at high level) and the block BLK<k> is selected (the block selection signal SBLK<k> is at high level).

The NAND circuit 22B receives the measurement mode signal Mcell at one input terminal via the inverter circuit 22E. The NAND circuit 22B receives the precharge signal PRE_LSA at the other input terminal. The output terminal of the NAND circuit 22B is connected to the other input terminal of the NAND circuit 22C via the inverter circuit 22F. The NAND circuit 22C outputs a precharge signal PRE_LSA<k>. Accordingly, the precharge signal PRE_LSA<k> is activated (to high level) when the precharge signal PRE_LSA is at high level and the selection signal Mcellon<k> is at low level (the block selection signal SBLK<k> is at low level).

FIG. 7 is a circuit diagram mainly illustrating a pair of global bit lines GBL and /GBL and pairs of local bit lines LBL and /LBL connected to the pair of global bit lines GBL and /GBL. Assume that a given block BLK<k> includes the pairs of local bit lines LBL and /LBL shown in FIG. 7.

A pair of intermediate lines INL and /INL are connected to a measurement switching circuit 32 to be used to measure the cell current. The measurement switching circuit 32 comprises two PMOS transistors 32-1 and 32-2 and two signal generators A1 and A2. The PMOS transistor 32-1 is connected in series between the intermediate line INL and a power line 21. The PMOS transistor 32-2 is connected in series between the intermediate line /INL and power line 21.

FIG. 8 is a circuit diagram illustrating an example of the signal generator A1 shown in FIG. 7. The signal generator A1 comprises a NOR circuit 51B and two inverter circuits 51A and 51C. The NOR circuit 51B receives the selection signal Mcellon<k> at one input terminal via the inverter circuit 51A. The other input terminal of the NOR circuit 51B is connected to the global bit line GBL. The output terminal of the NOR circuit 51B is connected to the input terminal of the inverter circuit 51A. The inverter circuit 51A outputs an output signal OUT_A1.

FIG. 9 is a circuit diagram illustrating an example of the signal generator A2 shown in FIG. 7. The signal generator A2 comprises a NOR circuit 52B and two inverter circuits 52A and 52C. The NOR circuit 52B receives the selection signal Mcellon<k> at one input terminal via the inverter circuit 52A. The other input terminal of the NOR circuit 52B is connected to the global bit line /GBL. The output terminal of the NOR circuit 52B is connected to the input terminal of the inverter circuit 52C. The inverter circuit 52C outputs an output signal OUT_A2.

Also, the pair of intermediate lines INL and /INL are connected to a precharge circuit 42 for a local sense amplifier (LSA). The precharge circuit 42 comprises two PMOS transistors 42A and 42B and two signal generators B1 and B2. The PMOS transistor 42A is connected in series between a power supply terminal to which a power supply voltage VDD is supplied and the intermediate line INL. The PMOS transistor 42B is connected in series between a power supply terminal to which the power supply voltage VDD is supplied and the intermediate line /INL.

FIG. 10 is a circuit diagram illustrating an example of the signal generator B1 shown in FIG. 7. The signal generator B1 comprises an inverter circuit 53A and two NAND circuits 53B and 53C. The NAND circuit 53B receives the selection signal Mcellon<k> at one input terminal. The other input terminal of the NAND circuit 53B is connected to the global bit line GBL via the inverter circuit 53A. The output terminal of the NAND circuit 53B is connected to one input terminal of the NAND circuit 53C. The NAND circuit 53C receives the precharge signal PRE_LSA<k> at the other input terminal. The NAND circuit 53C outputs an output signal OUT_B1.

Figures 11, 12:
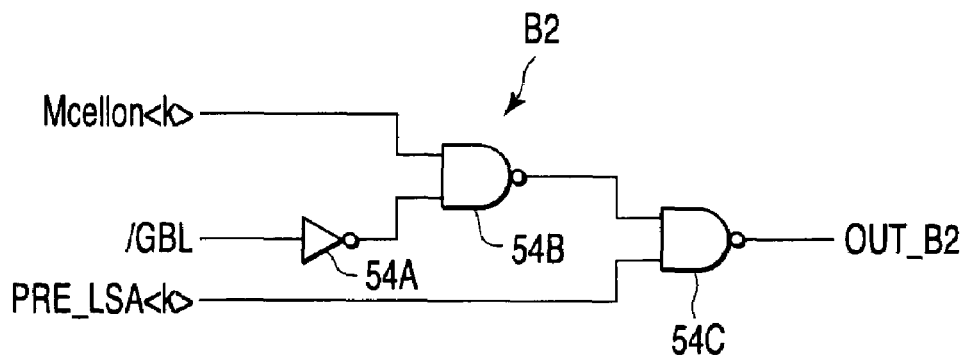
FIG. 11 is a circuit diagram illustrating an example of a signal generator B2 shown in FIG. 7.
FIG. 12 is a view illustrating a truth table of output signals OUT_A1 to OUT_B2, a selection signal Mcellon, and a precharge signal /PRE_LBL.

FIG. 11 is a circuit diagram illustrating an example of the signal generator B2 shown in FIG. 7. The signal generator B2 comprises an inverter circuit 54A and two NAND circuits 54B and 54C. The NAND circuit 54B receives the selection signal Mcellon<k> at one input terminal. The other input terminal of the NAND circuit 54B is connected to the global bit line /GBL via the inverter circuit 54A. The output terminal of the NAND circuit 54B is connected to one input terminal of the NAND circuit 54C. The NAND circuit 54C receives the precharge signal PRE_LSA<k> at the other input terminal. The NAND circuit 54C outputs an output signal OUT_B2.

The operation of the SRAM constructed as above will be explained below. FIG. 12 is a view illustrating a truth table of the output signals OUT_A1 to OUT_B2, the selection signal Mcellon, and a precharge signal /PRE_LBL. Note that "Selected LSA" shown in FIG. 12 indicates a local sense amplifier LSA included in a block selected by the block selection signal SBLK and connected to the pair of global bit lines GBL and /GBL selected by a column decoder 18, and indicates the pair of intermediate lines INL and /INL connected to this LSA. "Unselected LSA" shown in FIG. 12 indicates a local sense amplifier LSA except for the selected LSA (and the pair of intermediate lines INL and /INL connected to this LSA).

In normal operations, the output signals OUT_A1 and OUT_A2 are at high level (H) and the PMOS transistors 32-1 and 32-2 for cell current measurement are OFF in both the selected LSA and unselected LSA. On the other hand, the PMOS transistors 42A and 42B for precharge controlled by the output signals OUT_B1 and OUT_B2 execute the operation of precharging the pair of local bit lines LBL and /LBL in accordance with the inverted signal /PRE_LSA of the precharge signal PRE_LSA. Similarly, the precharge circuit 31 executes the operation of precharging pairs of bit lines LBL<0> and /LBL<0> to LBL<m> and /LBL<m> in accordance with the precharge signal /PRE_LBL.

The operation of the cell current measurement mode will now be explained. First, the main controller 19 deactivates the precharge signal /PRE_LBL (to high level). This turns off all the PMOS transistors of the precharge circuit 31, and cancels precharging of the pair of local bit lines LBL and /LBL.

Then, in the selected LSA, one of the output signals OUT_A1 and OUT_A2 changes to low level in accordance with the potential of the pair of global bit lines GBL and /GBL (this potential is set by the same operation as in the first embodiment), and a PMOS transistor corresponding to this low-level output signal is turned on. In this state, both the output signals OUT_B1 and OUT_B2 are at high level, and both the PMOS transistors 42A and 42B are OFF. Accordingly, a cell current corresponding to a measurement voltage Vm can be measured from a measurement terminal 20 via the PMOS transistor 32-1 or 32-2.

On the other hand, in the unselected LSA, both the output signals OUT_A1 and OUT_A2 change to high level, and both the PMOS transistors 32-1 and 32-2 are turned off. Also, both the output signals OUT_B1 and OUT_B2 change to low level, and both the PMOS transistors 42A and 42B are turned on. Accordingly, the unselected LSA is always precharged.

Since, therefore, the high voltage (VDD) is applied to both the gate terminals and source terminals of the PMOS transistors 32-1 and 32-2 for cell current measurement connected to the unselected LSA, neither gate leakage nor off leakage occurs in these PMOS transistors. That is, it is possible to prevent a leakage current from flowing to the power line 21 via the PMOS transistors 32-1 and 32-2. Accordingly, even when the memory capacity increases and the number of the PMOS transistors 32-1 and 32-2 for cell current measurement connected to the power line 21 increases, the cell current can be measured with high accuracy by using the measurement terminal 20.

It is also possible to reduce the number of PMOS transistor stages in the measurement switching circuit 32 to one. As a consequence, the cell current can be measured with higher accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor memory device comprising:
a plurality of memory cell columns each having a plurality of memory cells, each memory cell including a plurality of MIS (Metal Insulator Semiconductor) transistors and being a static type;
a plurality of local bit lines connected to the memory cell columns, respectively;
a global bit line connected to the local bit lines via a plurality of sense amplifiers;

a measurement terminal to which a measurement voltage is applied in a cell current measurement mode; and a plurality of switching circuits provided to correspond to the local bit lines, configured to electrically connect the measurement terminal and one of the local bit lines in the cell current measurement mode, and turned on or off by a voltage of the global bit line.

2. The device according to claim 1, which further comprises a selection circuit which receives a measurement signal to be activated in the cell current measurement mode, and sends the measurement signal to a switching circuit corresponding to a memory cell column as an object of measurement, and in which the switching circuit controls connection on the basis of the measurement signal.

3. The device according to claim 2, wherein the switching circuit includes a first p-type MIS transistor and a second p-type MIS transistor connected in series between the measurement terminal and a local bit line, a gate terminal of the first p-type MIS transistor is connected to the global bit line, and the measurement signal is supplied to a gate terminal of the second p-type MIS transistor.

4. The device according to claim 3, wherein the global bit line is set at low level in the cell current measurement mode.

5. The device according to claim 1, further comprising a plurality of word lines provided to correspond to the memory cells, and configured to select one of the memory cells.

6. The device according to claim 1, wherein the measurement terminal is also used as a power supply terminal to which a high-level voltage of the local bit lines is applied.

7. The device according to claim 1, wherein the memory cell includes a first inverter circuit, a second inverter circuit, and a transfer transistor, each of the first inverter circuit and the second inverter circuit includes a load transistor and a driving transistor, the load transistor has a source terminal connected to a first power, a gate terminal connected to a gate terminal of the driving transistor, and a drain terminal connected to a drain terminal of the driving transistor via a memory node, the driving transistor has a source terminal connected to a second power, and the transfer transistor is connected between a local bit line and the memory node.

8. The device according to claim 1, wherein the switching circuits electrically connect the measurement terminal and the local bit lines without passing the global bit line.

9. A semiconductor memory device comprising:

a plurality of blocks each having a plurality of memory cell columns, each memory cell column having a plurality of memory cells, and each memory cell including a plurality of MIS (Metal Insulator Semiconductor) transistors and being a static type;

a plurality of local bit lines connected to the memory cell columns, respectively;

a plurality of intermediate lines provided to correspond to the blocks, each intermediate line being connected to the local bit lines via a plurality of column switches;

a global bit line connected to the intermediate lines via a plurality of sense amplifiers;

a measurement terminal to which a measurement voltage is applied in a cell current measurement mode; and a plurality of switching circuits provided to correspond to the intermediate lines, and configured to electrically connect the measurement terminal and one of the intermediate lines in the cell current measurement mode, and turned on or off by a voltage of the global bit line.

10. The device according to claim 9, which further comprises a selection circuit which receives a measurement signal to be activated in the cell current measurement mode, and sends the measurement signal to a switching circuit corresponding to a block including a memory cell column as an object of measurement, and in which the switching circuit controls connection on the basis of the measurement signal.

11. The device according to claim 10, wherein the switching circuit includes a first p-type MIS transistor and a second p-type MIS transistor connected between the measurement terminal and an intermediate line, a gate terminal of the first p-type MIS transistor is connected to the global bit line, and the measurement signal is supplied to a gate terminal of the second p-type MIS transistor.

12. The device according to claim 11, wherein the global bit line is set at low level in the cell current measurement mode.

13. The device according to claim 10, wherein the switching circuit comprises a p-type MIS transistor connected between the measurement terminal and an intermediate line.

14. The device according to claim 13, wherein the switching circuit includes a signal generator connected to a gate terminal of the p-type MIS transistor, configured to switch ON and OFF of the p-type MIS transistor on the basis of the measurement signal and a voltage of the global bit line.

15. The device according to claim 10, further comprising a plurality of precharge circuits connected to the intermediate lines, respectively, and configured to charge an unselected intermediate line to a predetermined voltage in the cell current measurement mode.

16. The device according to claim 15, wherein each precharge circuit includes a p-type MIS transistor connected between a power and the intermediate line.

17. The device according to claim 16, wherein the precharge circuit includes a signal generator connected to a gate terminal of the p-type MIS transistor, and configured to switch ON and OFF of the p-type MIS transistor on the basis of the measurement signal and a precharge signal to be activated in a precharge mode.

18. The device according to claim 9, further comprising a plurality of word lines provided to correspond to the memory cells, and configured to select one of the memory cells.

19. The device according to claim 9, wherein the measurement terminal is also used as a power supply terminal to which a high-level voltage of the local bit lines is applied.

20. The device according to claim 9, wherein each memory cell includes a first inverter circuit, a second inverter circuit, and a transfer transistor, each of the first inverter circuit and the second inverter circuit includes a load transistor and a driving transistor, the load transistor has a source terminal connected to a first power, a gate terminal connected to a gate terminal of the driving transistor, and a drain terminal connected to a drain terminal of the driving transistor via a memory node, the driving transistor has a source terminal connected to a second power, and the transfer transistor is connected between a local bit line and the memory node.

* * * * *